United States Patent
Noda

[11] Patent Number: 6,101,098
[45] Date of Patent: Aug. 8, 2000

[54] STRUCTURE AND METHOD FOR MOUNTING AN ELECTRIC PART

[75] Inventor: Yuuji Noda, Tokyo, Japan

[73] Assignee: NEC Corporation, Tokyo, Japan

[21] Appl. No.: 09/249,702

[22] Filed: Feb. 12, 1999

[30] Foreign Application Priority Data

Feb. 17, 1998 [JP] Japan ................... 10-049977

[51] Int. Cl.[7] ................... H05K 7/06
[52] U.S. Cl. ................... 361/760; 361/783; 361/820; 257/787; 257/788; 257/791; 174/255; 174/260; 174/261; 228/180.21
[58] Field of Search ................... 361/760, 683, 361/820, 813; 257/787, 788, 790, 791, 686; 174/52.4, 52.2, 255, 260, 261; 228/180.21

[56] References Cited

U.S. PATENT DOCUMENTS

| | | | |
|---|---|---|---|
| 4,814,943 | 3/1989 | Okuaki | 361/783 |
| 4,926,240 | 5/1990 | Regione . | |
| 5,313,365 | 5/1994 | Pennisi et al. | 361/760 |
| 5,332,864 | 7/1994 | Liang et al. | 174/52.4 |
| 5,336,931 | 8/1994 | Juskey et al. | 257/787 |
| 5,577,319 | 11/1996 | Knecht | 29/827 |
| 5,885,854 | 3/1999 | Wensel | 438/124 |

FOREIGN PATENT DOCUMENTS

| | | |
|---|---|---|
| 0 457 260 A1 | 11/1991 | European Pat. Off. . |
| 0 602 298 A1 | 6/1994 | European Pat. Off. . |
| 4-214654 | 8/1992 | Japan . |
| 9-36549 | 2/1997 | Japan . |
| 2 195 825 | 4/1988 | United Kingdom . |
| WO 88/09056 A1 | 11/1988 | WIPO . |

*Primary Examiner*—Jeffrey Gaffin
*Assistant Examiner*—David Foster
*Attorney, Agent, or Firm*—Scully, Scott, Murphy & Presser

[57] ABSTRACT

A structure in which an electronic part is mounted on a substrate via mount resin and has electrodes thereof connected to electrodes arranged on the substrate for wire bonding by conductors is disclosed. A frame for preventing the mount resin from flowing out is formed on the substrate between a portion for mounting the electronic part and the electrodes for wire bonding. The structure prevents the mount resin from flowing out with a relatively simple scheme at low cost, and allows the number of semiconductor chips or similar electronic parts to be increased in order to implement high-density buildup wiring.

9 Claims, 3 Drawing Sheets

STRUCTURE AND METHOD FOR MOUNTING AN ELECTRIC PART

BACKGROUND OF THE INVENTION

The present invention relates to a structure and a method for mounting an electronic part and more particularly to a structure and a method for mounting a semiconductor chip to a printed circuit board by a COB (Chip On Board) scheme.

It is a common practice with a COB type mounting structure to hollow out the portion of a printed circuit board expected to mount a semiconductor chip. The hollowed portion prevents mount resin from flowing out to electrodes arranged on the printed circuit board at the time of mounting of the semiconductor chip.

However, hollowing the printed circuit board needs an extra step and therefore an extra cost. Moreover, the area of the printed circuit board available for a buildup wiring layer is reduced because the buildup wiring layer is absent beneath the portion for mounting the semiconductor chip. This is particularly true when a number of semiconductor chips must be densely mounted to the printed circuit board or when the buildup wiring layer must be dense.

Technologies relating to the present invention are also disclosed in, e.g., Japanese Patent Laid-Open Publication Nos. 4-214654 and 9-36549.

SUMMARY OF THE INVENTION

It is therefore an object of the present invention to provide a structure and a method capable of preventing mount resin from flowing out with a relatively simple method at low cost and allowing the number of semiconductors or similar electronic parts to be mounted to be increased and therefore promoting the dense arrangement of a buildup wiring layer.

In accordance with the present invention, in a structure in which an electronic part is mounted on a substrate via mount resin and has electrodes thereof connected to electrodes arranged on the substrate for wire bonding by conductors, a frame for preventing the mount resin from flowing is formed on the substrate between a portion for mounting the electronic part and the electrodes for wire bonding.

Also, in accordance with the present invention, a method of mounting an electronic part to a substrate via mount resin and connecting the electrodes of the electronic part to electrodes arranged on the substrate for wire bonding by conductors includes the steps of applying the mount resin to a portion of the substrate for mounting the electronic part, positioning the electronic part in the portion of the substrate, and then curing the mount resin, connecting the electrodes of the electronic part and the electrodes for wire bonding by fine metal wires to thereby set up electric conduction.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1:
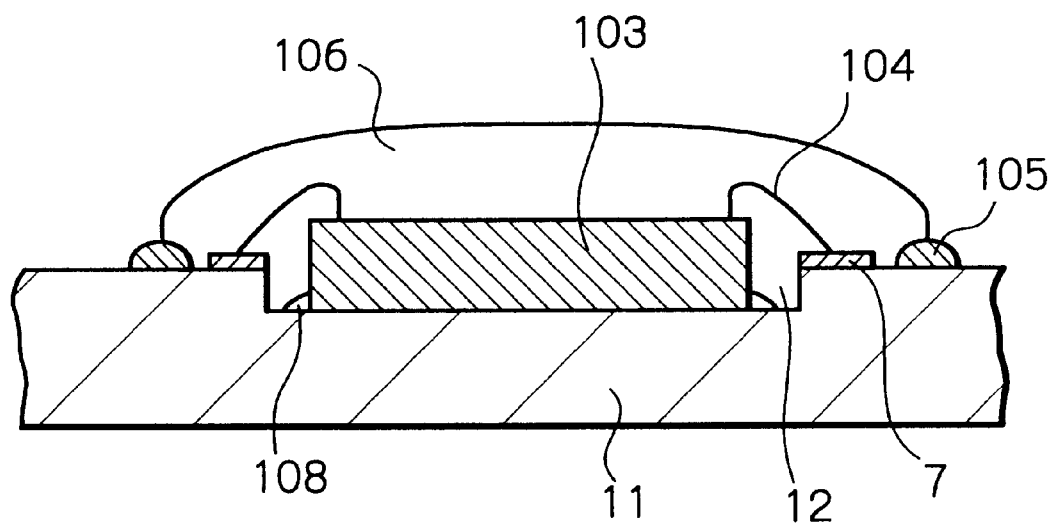
FIG. 1 is a section showing a conventional structure for mounting an electronic part.

To better understand the present invention, brief reference will be made to a conventional structure for mounting an electronic part, particularly a structure for mounting a semiconductor chip by the COB scheme, shown in FIG. 1. As shown, a printed circuit board includes a core layer 11. The core layer 11 has its portion 12 expected to mount a semiconductor chip 103 hollowed out. The hollowed portion 12 prevents mount resin 108 used to mount the semiconductor chip 103 from flowing out to electrodes 7 arranged on the printed circuit board. This kind of structure, however, has some problems left unsolved, as discussed earlier.

Figure 2:
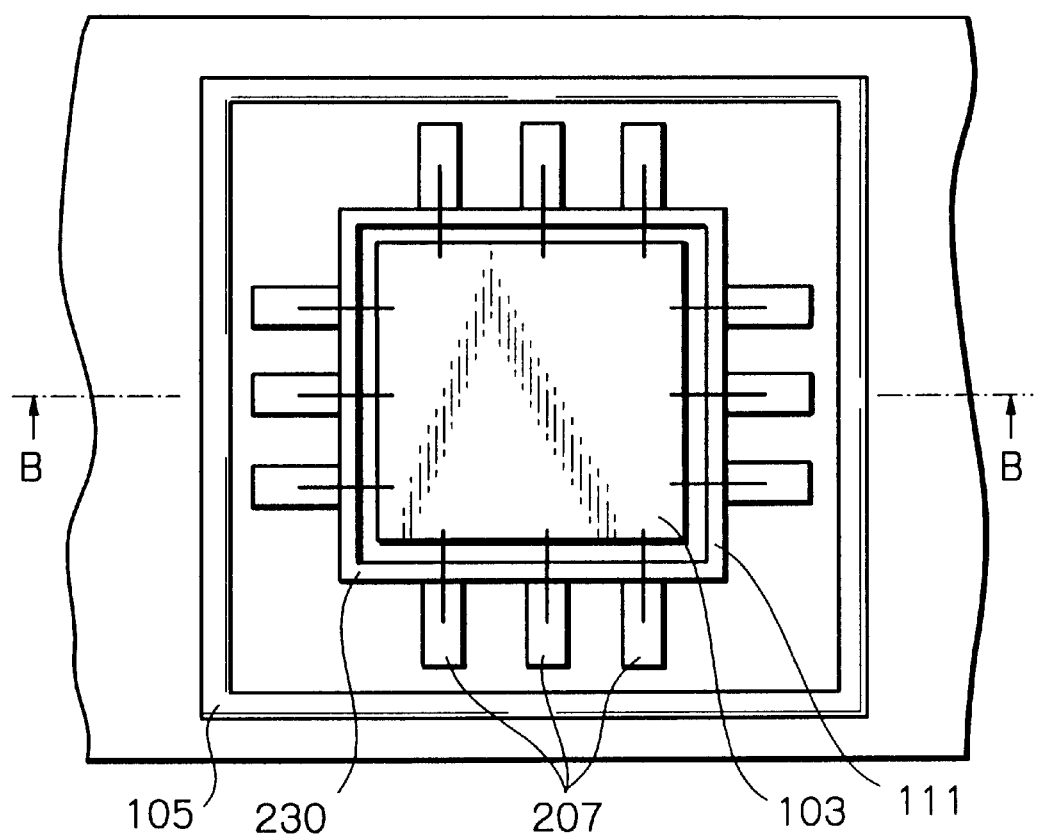
FIG. 2 is a perspective plan view showing a structure for mounting an electronic part embodying the present invention.
Figure 3:
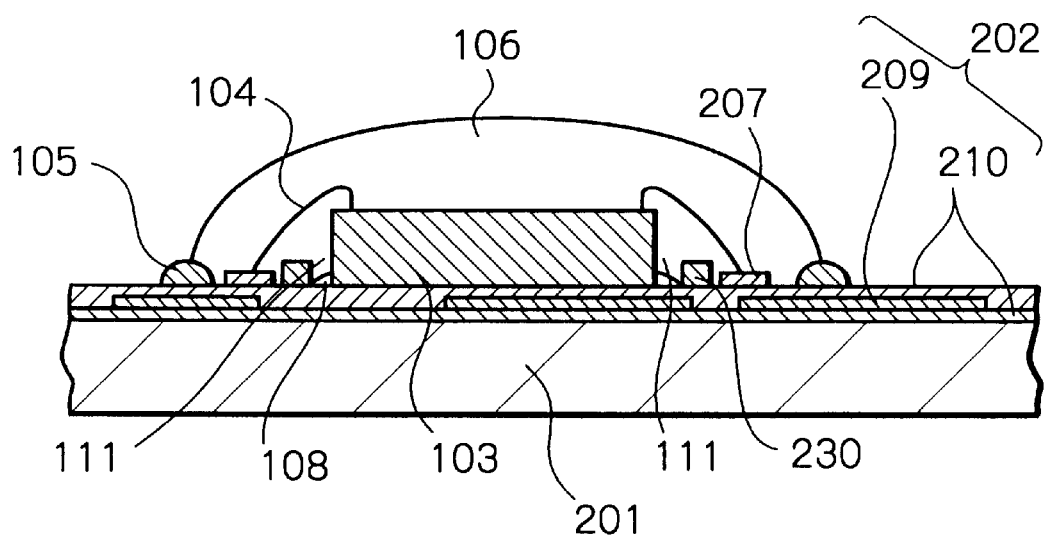
FIG. 3 is a section along line B—B of FIG. 2.

Referring to FIGS. 2 and 3, a structure for mounting a semiconductor chip embodying the present invention will be described. As shown, a semiconductor chip 103 is mounted on a preselected portion 111 of a printed circuit board. A frame 230 is formed on the printed circuit board around the semiconductor chip 103. The frame 230 prevents mount resin 108 from flowing out to electrodes 207 arranged on the printed circuit board. In addition, the frame 230 allows even a portion of a buildup wiring layer 202 positioned beneath the semiconductor chip 103 to be used.

Specifically, as shown in FIG. 3, the printed circuit board includes a core layer 201. The buildup wiring layer 202 is formed on the core layer 201 and made up of a conductive layer 209 and insulating resin layers 210. The part of the buildup wiring layer 202 beneath the portion 111 of the printed circuit board is not removed. The semiconductor chip 103 is mounted even on the portion of the buildup wiring layer 202 beneath the above portion 111. Stated another way, the wiring layer 202 is formed on the printed circuit board even at the position beneath the portion 111 for mounting the semiconductor chip 103. The frame 230 intervenes between the semiconductor chip 103 and the electrodes 207 and fully surrounds the chip 103.

The frame 230 may be provided with any desired cross-section so long as it can sufficiently prevent the mount resin 108 from flowing out. The frame 230 is effective even when its sectional area is small. Preferably, the cross-section of the frame 230 should be a rectangle close to a square, as illustrated and is at least 0.1 mm high. The crux is that the frame 230 has a cross-section that is relatively small and easy to form.

The frame 230 can obstruct the flow of the mount resin 108 more positively as the distance between the frame 230 and the semiconductor chip 103 increases. Therefore, the frame 230 should preferably be positioned as close to the electrodes 207 as possible.

A procedure for mounting the semiconductor chip 103 to the printed circuit board is as follows. First, the insulating resin layer 210 is formed on the core layer 201. Subsequently, a copper film or similar conductive film is formed by any conventional technology in order to form the conductive layer 209 having a desired pattern. These steps are repeated to complete the buildup wiring layer 202. In the illustrative embodiment, the buildup wiring layer 202 consists of two layers by way of example, as shown in FIG. 3.

Subsequently, the frame 230 is formed on the buildup wiring layer 202 around the portion 111 expected to mount the semiconductor chip 103. The frame 230 may be one formed by the screen printing of, e.g., solder resist, or by one formed of the same material as the printed circuit board and affixed to the circuit board by adhesive.

After the frame 230 has been formed, the mount resin 108 is applied to the portion 111 for mounting the semiconductor chip 103, and then the chip 103 is mounted to the portion 111. After the mount resin 108 has been cured by, e.g., heat, the electrodes, not shown, of the semiconductor chip 103 and the electrodes 207 arranged on the printed circuit board are connected by fine wires 104 of gold or similar metal. Finally, the semiconductor chip 103 and wires 104 are sealed with resin 106 contained with a second frame 105.

The frame 230 can be formed by screen printing or similar simple method, as stated above. It is therefore not necessary to hollow out or otherwise treat the printed circuit board by an extra step, so that the mounting structure is low cost.

Further, the dense wiring of the buildup wiring layer 202 is positioned even beneath the semiconductor chip 103, implementing a high density printed circuit board. The frame 230 intervening between the semiconductor chip 103 and the electrodes 207 successfully prevents the mount resin 108 from flowing out to the electrodes 207.

Moreover, the frame 230 protrudes from the printed circuit board and therefore supports the wires 104 when the wires 104 hang down by accident. This prevents the wires 104 from contacting the periphery of the semiconductor chip 103 or the electrodes 207 adjoining desired electrodes 207 and shorting the circuitry.

While the above embodiment has concentrated on a printed circuit board including a buildup wiring layer, the advantages stated above are also achievable when the frame 230 is formed on a printed circuit board lacking a buildup wiring layer.

In the illustrative embodiment, an electronic part to be mounted to a printed circuit board is assumed to be a semiconductor chip having multiple pins. The present invention is similarly applicable to a semiconductor chip having a small number of pins, e.g., a transistor or a diode. Of course, an electronic part to be dealt with is not limited to a semiconductor chip, but may be a resistor, a capacitor or a composite part.

In summary, it will be seen that the present invention provides a mounting structure capable of preventing mount resin from flowing out with a relatively simple scheme at low cost, and allowing the number of semiconductor chips or similar electronic parts to be mounted to be increased in order to implement high density buildup wiring. Particularly, a high density printed circuit board is achievable because a buildup wiring layer is available even beneath an electronic part mounted on the circuit board.

Various modifications will become possible for those skilled in the art after receiving the teachings of the present disclosure without departing from the scope thereof.

What is claimed is:

1. In a structure in which an electronic part is mounted on a substrate via mount resin wherein the electronic part has first electrodes directly connected to second electrodes arranged on said substrate for wire bonding by conductors, a frame for preventing said mount resin from flowing to said second electrodes is formed on said substrate between said electronic part and said second electrodes for wire bonding.

2. A structure as claimed in claim 1, wherein said frame fully surrounds the electronic part.

3. A structure as claimed in claim 2, wherein said frame is positioned close to said electrodes for wire bonding.

4. A structure as claimed in claim 3, wherein said frame is at least 0.1 mm high.

5. A structure as claimed in claim 4, wherein said substrate comprises a printed circuit board.

6. A structure as claimed in claim 5, wherein the electronic part comprises a semiconductor chip.

7. A method of mounting an electronic part to a substrate via mount resin and directly connecting first electrodes of said electronic part to second electrodes arranged on said substrate for wire bonding by conductors, said method comprising the steps of:

positioning a frame between said electronic part and said second electrodes for preventing said mount resin from flowing to said second electrodes;

applying the mount resin to a portion of said substrate for mounting the electronic part;

positioning the electronic part in said portion of said substrate, and then curing the mount resin; and connecting the first electrodes to the second electrodes by wire bonding with fine metal wires to thereby set up electric conduction therebetween.

8. A method as claimed in claim 7, wherein said substrate comprises a printed circuit board.

9. A method as claimed in claim 8, wherein the electronic part comprises a semiconductor chip.

* * * * *